United States Patent [19]
Han

[11] Patent Number: 6,107,173
[45] Date of Patent: Aug. 22, 2000

[54] METHOD OF MANUFACTURING SEMICONDUCTOR DEVICE

[75] Inventor: Suk Bin Han, Chungcheongbuk-do, Rep. of Korea

[73] Assignee: LG Semicon Co., Ltd., Chungcheongbuk-do, Rep. of Korea

[21] Appl. No.: 09/057,373

[22] Filed: Apr. 9, 1998

[30] Foreign Application Priority Data

Sep. 26, 1997 [KR] Rep. of Korea ..................... 97-49219

[51] Int. Cl.⁷ ..................... H01L 21/336; H01L 21/4763
[52] U.S. Cl. .................. 438/585; 438/279; 438/283; 438/587
[58] Field of Search ..................... 438/279, 585, 438/587, 283

[56] References Cited

U.S. PATENT DOCUMENTS 5,574,294 11/1996 Shepard ..................... 257/66
5,849,641 12/1998 Arnett et al. ..................... 438/734

OTHER PUBLICATIONS

Guinn et al. (1995) J. Vac. Sci. Technol. B, vol. 13(2), No. 2, Mar./Apr. 1995, pp. 214–226.

Primary Examiner—John F. Niebling
Assistant Examiner—Alexander G. Ghyka
Attorney, Agent, or Firm—Birch, Stewart, Kolasch & Birch, LLP

[57] ABSTRACT

A method of manufacturing a semiconductor device, which is designed to enhance the characteristic of a dual-gate MOS by reducing the phase difference between two gate electrodes, includes the steps of: forming a first conductivity type substrate in which a portion to be first and second gate electrodes are defined; sequentially forming a gate insulating layer and a conductive coating on the substrate; ion-implanting first conductivity type impurities into the conductive coating of a portion where the first gate electrode will be formed; ion-implanting second conductivity type impurities into the conductive coating of a portion where the second gate electrode will be formed; selectively etching the conductive coating, leaving only a portion doped with the first and second conductivity type impurities, and forming the first and second gate electrodes; and forming impurity regions in the surface of the substrate on both sides of the first and second gate electrodes.

10 Claims, 4 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a semiconductor device to enhance the characteristic of a dual-gate MOS.

2. Discussion of Related Art

Generally speaking, a dual-gate MOS used in the process for below 0.25 μm level circuit has two gate electrodes. The MOS has its drain electrode connected to the source electrode of another MOS.

The dual-gate MOS confers the advantage that stable operation is performed without much internal feedback at a very high frequency, and, that a second gate electrode is available to an AGC (Auto Gain Control), thus producing little change in the input/output impedances with a good characteristic of cross modulation.

FIGS. 1a–1f illustrate a method of manufacturing a dual-gate MOS of the prior art.

As shown in FIG. 1a, a gate oxide layer 12 is grown on a p-type semiconductor substrate 11 with a thermal oxidation. On the gate oxide layer 12 is formed polysilicon 13a in the 2000 to 2500 Å range of thickness.

As shown in FIG. 1b, a first photoresist 14 is deposited on the polysilicon 13a, and it is selectively exposed and developed, removing only a portion of the first photoresist 14 where a first gate electrode will be formed. Following the exposure and development, p-type impurities are ion-implanted into the polysilicon 13a by using the first photoresist 14 as a mask in the $10^{13}$ to $10^{15}$ range of concentration and at the 10 to 15 KeV pressure. The p-type impurities are usually boron (B) ions.

As shown in FIG. 1c, the first photoresist 14 is removed and a second photoresist 15 is formed on the polysilicon 13a selectively doped with p-type impurities. The polysilicon 13a is selectively exposed and developed, removing only a portion where a second gate electrode will be formed. Using the second photoresist 15 as a mask, n-type impurities are ion-implanted into the polysilicon 13a in the $10^{13}$ to $10^{15}$ range of concentration and at the 10 to 15 KeV pressure. The n-type impurities are usually P ions.

As shown in FIG. 1d, following a removal of the second photoresist 15, the whole surface is cleaned and processed in an annealing which is performed for 20 to 40 minutes at the 700 to 900° C. temperature in the nitrogen (N$_2$) atmosphere.

On the polysilicon 13a annealed is sequentially formed a BARC 16 and a third photoresist 17. The third photoresist 17 is selectively exposed and developed, leaving only a portion where first and second gate electrodes will be formed.

As shown in FIG. 1e, using the third photoresist 17 as a mask, the polysilicon 13a is selectively etched at a back pressure above 8 Torr in a Cl$_2$/O$_2$ and HBr/Cl$_2$ atmosphere, for the purpose of protecting the third photoresist 17 from being burnt and producing a cooling effect in the maximum, thus forming first and second gate electrodes 13b and 13c. To produce polymer to the maximum in the etching process of the polysilicon 13a, a lateral etching is suppressed by adjusting the ratio of the mixed gas HBr/Cl$_2$ to more than 2:1. The back pressure produced is from He gas.

As shown in FIG. 1f, the third photoresist 17 and the BARC 16 are removed. The whole surface is doped with n-type impurities by using the first and second gate electrodes 13b and 13c as a mask, followed by a drive-in diffusion. Thus, impurity regions 18, that is, first and second sources and first and second drain regions are formed in the surface on the semiconductor substrate 11 on both sides of the first and second gate electrodes 13b and 13c.

In manufacturing a dual-gate MOS of the prior art as described above, the polysilicon 13a doped with the n-type impurities is etched at the same time with that doped with the p-type impurity so as to form the first and second gate electrodes 13b and 13c. The high back pressure is adjusted to above 8 Torr in etching the polysilicon 13a doped with the p-type impurities, so that the top portion of the layer 13a is hotter than the bottom, producing much more polymers at the bottom than in the top portion and especially etching the bottom less. Thus the formed first gate electrode 13b has the trapezoid shape.

Since the polysilicon 13a doped with the n-type impurities is more etched than that doped with the p-type impurities, the bottom of the polysilicon 13a is over-etched to produce the second gate electrode 13c in the vertical form.

A method of manufacturing a semiconductor device according to the prior art presents some disadvantages in that one of the two gate electrodes in a dual-gate MOS is produced in the trapezoid form and that a large phase difference is made between the first and second gate electrodes, deteriorating the characteristic of the dual-gate MOS.

SUMMARY OF THE INVENTION

Accordingly, the present invention is directed to a method of manufacturing a semiconductor device that substantially obviates one or more of the problems due to limitations and disadvantages of the related art.

An object of the present invention is to provide a method of manufacturing a semiconductor device which is designed to enhance the characteristic of a dual-gate MOS by reducing the phase difference between the two gate electrodes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of manufacturing a semiconductor device includes the steps of: forming a first conductivity type substrate in which a portion to be first and second gate electrodes are defined; sequentially forming a gate insulating layer and a conductive coating on the substrate; ion-implanting first conductivity type impurities into the conductive coating of a portion where the first gate electrode will be formed; ion-implanting second conductivity type impurities into the conductive coating of a portion where the second gate electrode will be formed; selectively etching the conductive coating, leaving only a portion doped with the first and second conductivity type impurities, and forming the first and second gate electrodes; and forming impurity regions in the surface of the substrate on both sides of the first and second gate electrodes.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 1a–1f are cross sections illustrating a method of manufacturing a dual-gate MOS according to the prior art; and FIGS. 2a–2f are cross sections illustrating a method of manufacturing a dual-gate MOS in accordance with the present invention.

DETAILED DESCRIPTION OF PREFERRED EMBODIMENT

Reference will now be made in detail to the preferred embodiments of the present invention, examples of which are illustrated in the accompanying drawings.

FIGS. 2a–2f illustrate a method of manufacturing a dual-gate MOS in accordance with the preferred embodiment of the present invention.

Figure 1A:
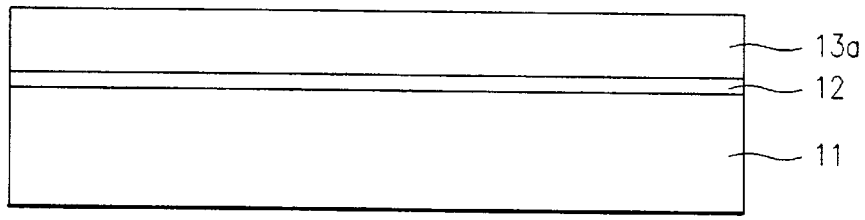
Figure 1B:
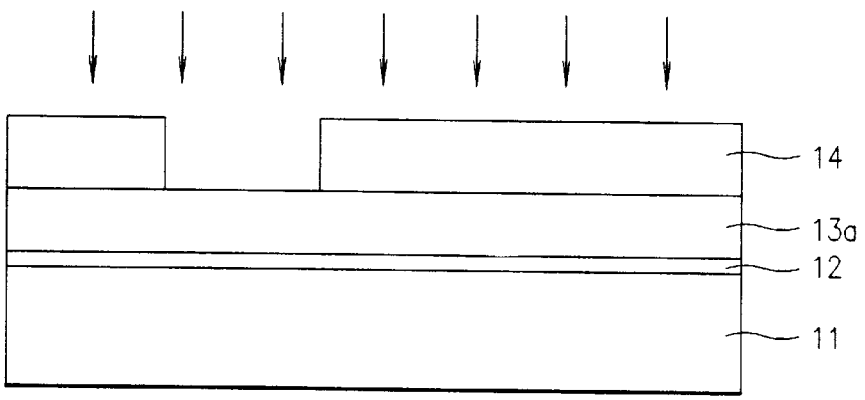
Figure 1C:
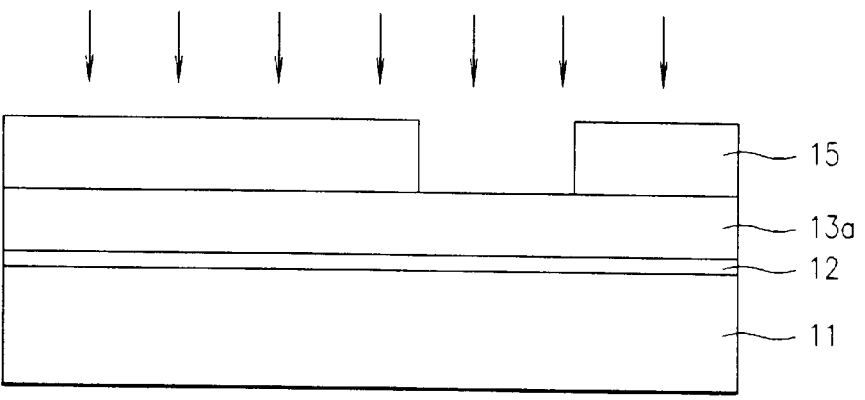
Figure 1D:
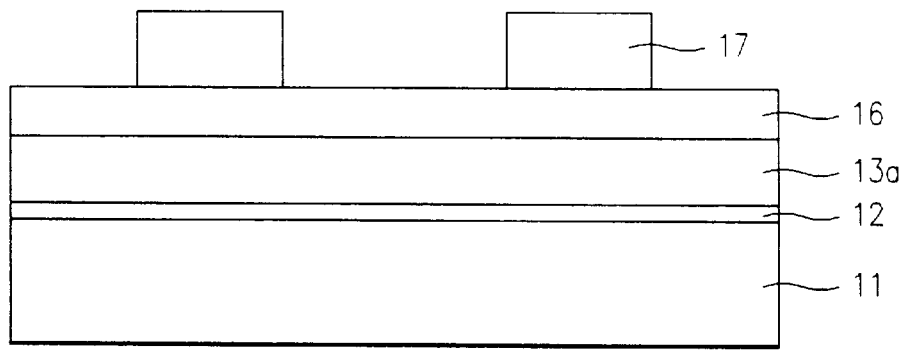
Figure 1E:
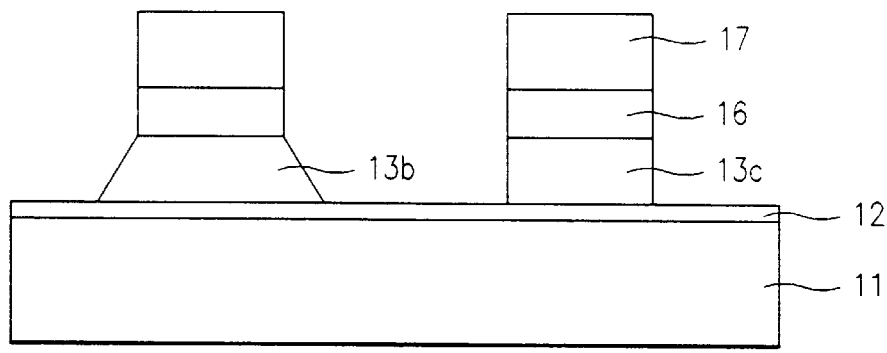
Figure 1F:
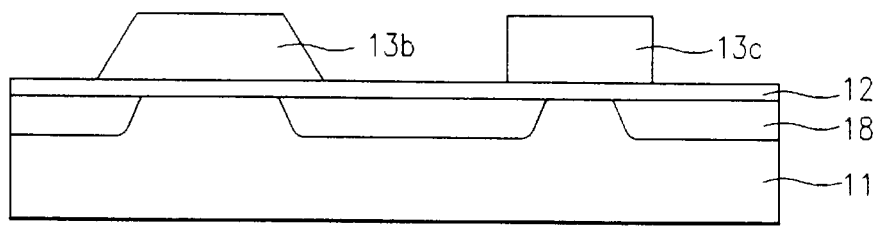
Figure 2A:
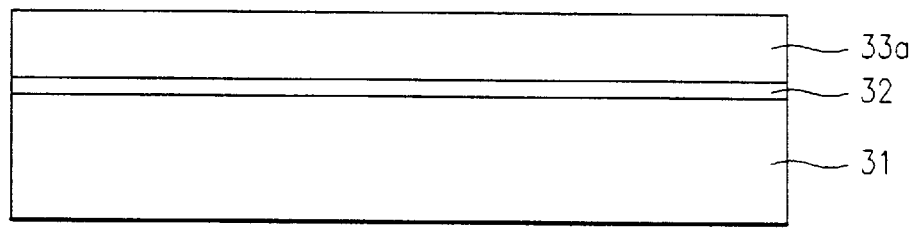

As shown in FIG. 2a, a gate oxide layer 32 is grown on a p-type semiconductor substrate 31 with a thermal oxidation. On the gate oxide layer 32 is formed polysilicon 33a in the 2000 to 2500 Å range of thickness.

Figure 2B:
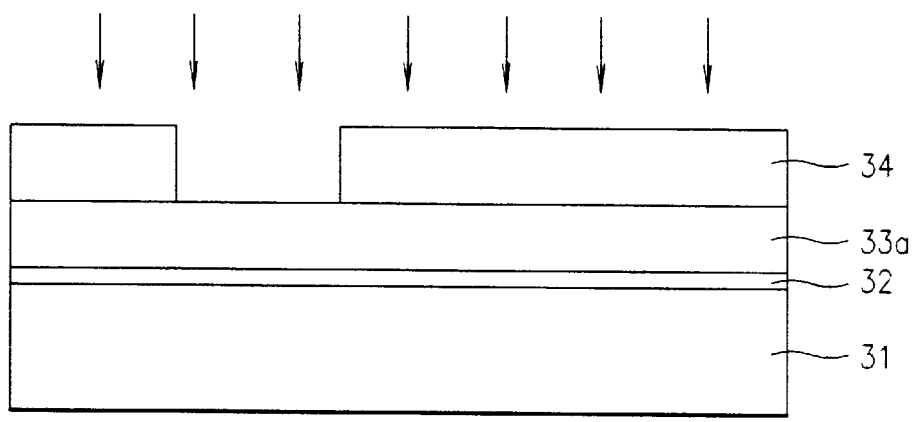

As shown in FIG. 2b, a first photoresist 34 is deposited on the polysilicon 33a, and it is selectively exposed and developed, removing only a portion of the first photoresist 34 where a first gate electrode will be formed. Following the exposure and development, p-type impurities are ion-implanted into the polysilicon 33a by using the first photoresist 34 as a mask in the $10^{13}$ to $10^{15}$ range of concentration and at the 10 to 15 KeV pressure. The p-type impurities are usually boron (B) ions.

Figure 2C:
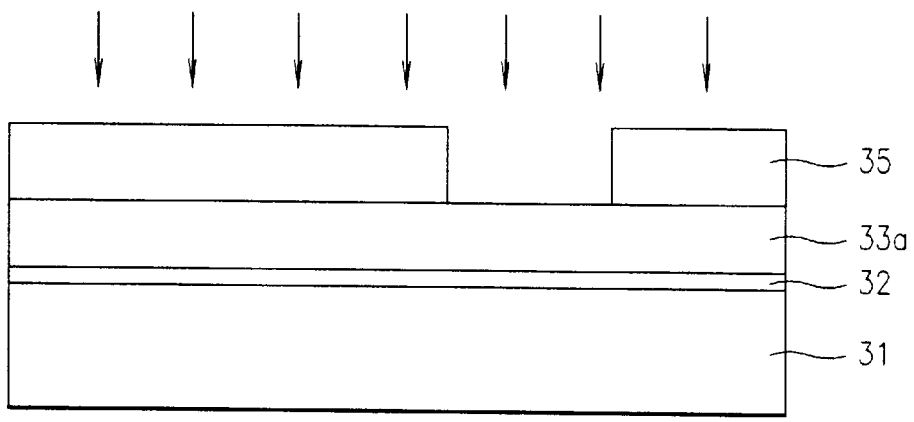

As shown in FIG. 2c, the first photoresist 34 is removed and a second photoresist 35 is formed on the polysilicon 33a selectively doped with p-type impurities. The polysilicon 33a is selectively exposed and developed, removing only a portion where a second gate electrode will be formed. Using the second photoresist 35 as a mask, n-type impurities are ion-implanted into the polysilicon 33a in the $10^{13}$ to $10^{15}$ range of concentration and at the 10 to 15 KeV pressure. The n-type impurities are usually P ions.

Figure 2D:
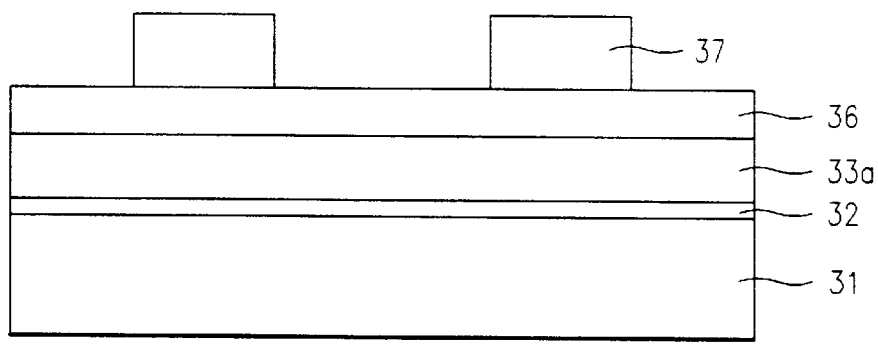

As shown in FIG. 2d, following a removal of the second photoresist 35, the whole surface is cleaned and processed in an annealing which is performed for 20 to 40 minutes at the 700 to 900° C. temperature in a nitrogen ($N_2$) atmosphere.

On the annealed polysilicon 33a is sequentially formed a BARC (Bottom Anti Reflection Coating) 36 and a third photoresist 37. The third photoresist 37 is selectively exposed and developed, leaving only a portion where the first and second gate electrodes will be formed.

Figure 2E:
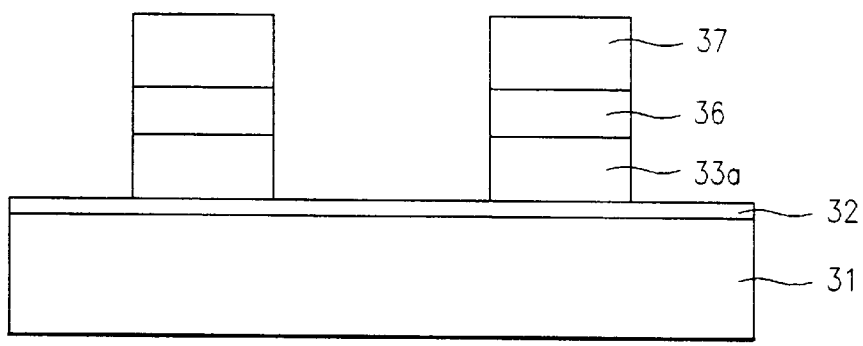

As shown in FIG. 2e, the BARC 36 is selectively etched by using the third photoresist 37 as a mask with a voltage between 300 and 400 W at the 7 to 9 mT pressure in an oxygen and silicic acid atmosphere.

Using the third photoresist 37 and the BARC 36 as a mask, the polysilicon 33a is selectively etched with MERIE (Magnetic Enhancement Reactive Ion Etching) equipment at a back pressure below 8 Torr, that is, between 2 and 6 Torr, and with a voltage of below 400 W and at the 0 to 200 mT pressure in the HBr/$Cl_2$ atmosphere, protecting the third photoresist 37 from being burnt, so that first and second gate electrodes 33b and 33c are formed. To regulate the production of polymer, the ratio of the mixed gas HBr/$Cl_2$ is preferably between 1:1 and 2:1. The back pressure produced is from He gas.

Figure 2F:
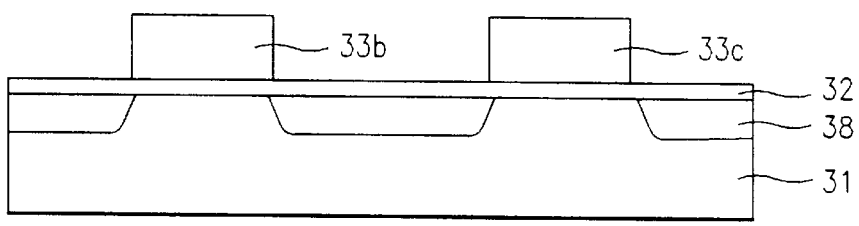

As shown in FIG. 2f, the third photoresist 37 and the BARC 36 are removed. The whole surface is doped with n-type impurities by using the first and second gate electrodes 33b and 33c as a mask, followed by a drive-in diffusion. Thus, impurity regions 38, that is, first and second sources and first and second drain regions are formed in the surface on the semiconductor substrate 31 on both sides of the first and second gate electrodes 33b and 33c.

In the method of manufacturing a dual-gate MOS according to the embodiment of the present invention as described above, the polysilicon 33a doped with the n-type impurities is etched at the same time with that doped with the p-type impurities so as to form the first and second gate electrodes 33b and 33c. In etching the polysilicon 33a doped with the p-type impurities, the back pressure is adjusted to below 8 Torr, that is, between 2 and 6 Torr, and the ratio of the mixed gas HBr/$Cl_2$ is between 1:1 and 2:1. Under that condition, the temperature difference between the top and bottom of the polysilicon 33a becomes insignificant, and the difference in the amount of produced polymers between them can be much reduced, etching the bottom as much as the top portion. Thus the first gate electrode 33b is not of the trapezoid form but produced in the vertical form.

As described above, the present invention produces the first and second electrode gates that are not formed in the trapezoid shade but in the vertical shape, reducing the phase difference between them, so that the gate oxide layer is less damaged and the characteristic of the dual-gate MOS is enhanced with the CD (Critical Dimension) difference decreased.

It will be apparent to those skilled in the art that various modifications and variations can be made in a method of manufacturing a semiconductor device of the present invention without departing from the spirit or scope of the invention. Thus, it is intended that the present invention cover the modifications and variations of this invention provided they come within the scope of the appended claims and their equivalents.

What is claimed is:

1. A method of manufacturing a semiconductor device, comprising the steps of:

providing a substrate;

forming a gate insulating layer on the substrate;

forming a conductive coating on the gate insulating layer;

forming a region of a first conductivity type at a first portion of the conductive coating;

forming a region of a second conductivity type at a second portion of the conductive coating; and etching the conductive coating at a back pressure of less than 8 Torr, the etching of the conductive coating including the steps of, producing the back pressure of less than 8 Torr with helium gas, and etching the conductive coating with a voltage of less than 400 W in an atmosphere of HBr/$Cl_2$ at a pressure of 0 to 200 mT.

2. The method of manufacturing a semiconductor device according to claim 1, wherein the step of forming a region of a first conductivity type includes the step of implanting first conductivity type impurities into the first portion.

3. The method of manufacturing a semiconductor device according to claim 1, wherein the step of forming a region of a second conductivity type includes the step of implanting second conductivity type impurities into the second portion.

4. The method of manufacturing a semiconductor device according to claim 1, prior to the etching step, further comprising the steps of:

forming a bottom anti reflection coating on the conductive coating; and disposing a photoresist over the bottom anti reflection coating, the photoresist overlaying the first and second portions of the conductive coating, with a remainder of the conductive coating left exposed.

5. The method of manufacturing a semiconductor device according to claim 4, wherein the step of etching the conductive coating includes the step of etching the exposed remainder of the conductive coating to form raised first and second gate electrodes from the first and second portions of the conductive coating.

6. The method of manufacturing a semiconductor device according to claim 5, further comprising the step of forming impurity regions in the substrate adjacent to opposed sides of the first and second gate electrodes.

7. The method of manufacturing a semiconductor device according to claim 1, wherein the etching step etches the conductive coating at a back pressure in the range of 2 to 6 Torr.

8. The method of manufacturing a semiconductor device according to claim 1, wherein the step of forming the region of first conductivity type includes the step of introducing p-type impurities into the first portion, and the step of forming the region of second conductivity type includes the step of introducing n-type impurities into the second portion.

9. The method of manufacturing a semiconductor device according to claim 1, wherein the step of forming a conductive coating on the gate insulating layer includes the step of depositing a layer of polysilicon on the gate insulating layer.

10. The method of manufacturing a semiconductor device according to claim 1, wherein the ratio of HBr to $Cl_2$ is between 1:1 and 2:1.

\* \* \* \* \*